(12) United States Patent
Nicol

(10) Patent No.: US 8,421,175 B2
(45) Date of Patent: Apr. 16, 2013

(54) WAFER LEVEL PACKAGED INTEGRATED CIRCUIT

(75) Inventor: Robert Nicol, Lanarkshire (GB)

(73) Assignee: STMicroelectronics ( Research & Development) Limited, Marlow-Buckinghamshire (GB)

( * ) Notice: Subject to any disclaimer, the term of this patent is extended or adjusted under 35 U.S.C. 154(b) by 425 days.

(21) Appl. No.: 12/556,827

(22) Filed: Sep. 10, 2009

(65) Prior Publication Data

US 2011/0057281 A1   Mar. 10, 2011

(51) Int. Cl.
*H01L 31/0232* (2006.01)

(52) U.S. Cl.
USPC .... 257/434; 257/433; 257/737; 257/E23.068; 257/E31.124; 257/E21.507; 438/118

(58) Field of Classification Search .......... 257/433, 257/434, 737, 739, E23.068, E31.124, E21.507; 438/118
See application file for complete search history.

(56) References Cited

U.S. PATENT DOCUMENTS

| | | | |
|---|---|---|---|
| 7,221,051 B2 * | 5/2007 | Ono et al. | 257/704 |
| 7,332,783 B2 * | 2/2008 | Misawa | 257/432 |
| 7,531,375 B2 * | 5/2009 | Wataya | 438/65 |
| 8,288,851 B2 * | 10/2012 | Yang et al. | 257/685 |
| 2007/0194418 A1 * | 8/2007 | Suminoe | 257/678 |
| 2008/0157250 A1 * | 7/2008 | Yang et al. | 257/433 |
| 2009/0001495 A1 * | 1/2009 | Weng et al. | 257/433 |
| 2010/0117181 A1 * | 5/2010 | Kim et al. | 257/432 |
| 2010/0276774 A1 * | 11/2010 | Yen et al. | 257/433 |
| 2011/0024862 A1 * | 2/2011 | Tu et al. | 257/434 |
| 2011/0291215 A1 * | 12/2011 | Tu et al. | 257/433 |

* cited by examiner

*Primary Examiner* — Allan R Wilson
(74) *Attorney, Agent, or Firm* — Allen, Dyer, Doppelt, Milbrath and & Gilchrist, P.A.

(57) ABSTRACT

A wafer level packaged integrated circuit includes an array of contacts, a silicon layer and a glass layer. The silicon and glass layers are bonded together to form a bonding material layer therebetween. The bonding material layer includes gaps between the silicon layer and the glass layer at areas where no bonding material is present. An array of contacts is adjacent the semiconductor layer on a side thereof opposite the bonding layer. The wafer level packaged integrated circuit is provided with additional bonding material layer portions within the gaps and aligned with at least some of the contacts. When the wafer level packaged integrated circuit is configured as an image sensor or display having a pixel array, the additional bonding material layer portions are not used in an area of the pixel array.

21 Claims, 3 Drawing Sheets

WAFER LEVEL PACKAGED INTEGRATED CIRCUIT

FIELD OF THE INVENTION

The present invention relates to integrated circuit packaging designs, and in particular, to wafer level packaged devices.

BACKGROUND OF THE INVENTION

Wafer-Level Packaging (WLP) refers to the technology of packaging an integrated circuit at wafer level, instead of packaging each individual unit after wafer dicing. WLP is essentially a chip-scale packaging (CSP) technology since the resulting package is practically the same size as the die. Furthermore, wafer-level packaging helps streamline the manufacturing process from wafer fabrication to customer shipment. It does this by allowing integration of wafer fabrication, packaging, test, and burn-in at wafer level.

Wafer-level packaging essentially includes extending the wafer fabrication processes to include device interconnection and device protection processes. One way of achieving this is by extending the conventional wafer fabrication process with an additional step that deposits a multi-layer thin-film metal rerouting and interconnection system to each device on the wafer. This is achieved using the same standard photolithography and thin film deposition techniques employed in the device fabrication itself.

This additional level of interconnection redistributes the peripheral bonding pads of each chip to an area array of underbump metal (UBM) pads that are evenly deployed over the chip's surface. The solder balls or bumps used in connecting the device to the application circuit board are subsequently placed over these UBM pads.

For solid state imaging systems (e.g., CMOS/COD cameras), WLP generally tends to include a glass cover on the device. This provides the added benefits of securing the sensitive image sensor surface during the added manufacturing processes for the additional interconnects, under bump metalization, passivations, additional processes and solder bumping processes. Other benefits include providing a foreign material protection of the image sensor surface. Since the outside surface of the device is now some distance (the thickness of the glass and the bonding layer) away from the image sensor surface, the effects of added defects in subsequent processing and camera assembly can be reduced. The outer glass surface puts the defects out of the focal plane of the camera system.

Wafer level packed devices, and in particular, wafer level packed electro-optical devices implemented with an air-gap between a cover glass and silicon substrate, have rigidity and stress problems. It would be desirable to improve such devices.

SUMMARY OF THE INVENTION

In a first aspect of the present invention, a wafer level packaged integrated circuit comprises at least one main semiconductor layer and a first protective layer. The at least one main semiconductor layer and the first protective layer may be bonded together by a bonding material to form a bonding layer therebetween. The bonding layer may include gaps between the at least one main semiconductor layer and the first protective layer at the areas where no bonding material is present. The integrated circuit may further comprise an array of contacts to operatively connect to the integrated circuit.

The integrated circuit may be provided with an additional bonding material between at least some of the contacts and the first protective layer. The additional bonding material may preferably be located in the bonding layer. The additional bonding material may transmit forces from the contacts to the protective layer. The bonding layer may comprise bonding material disposed in rectilinear paths, and in one embodiment, form two rectangular shapes, one inside the other.

The contacts may comprise solder bumps. The contacts may be located on an underside of the semiconductor layer. The semiconductor layer may comprise a silicon based material. The integrated circuit may be configured as a three-dimensional structure using TSV (Through Silicon Via) technology.

In a second aspect of the present invention, an image sensor or display comprises an array of pixels, wherein the image sensor or display may be included in a wafer level packaged integrated circuit according to the first aspect. The integrated circuit may not comprise any additional bonding material in the vicinity of the pixel array. The protective layer may comprise at least a partially transparent material, such as glass, so as to allow light onto the pixel array.

The image sensor or display may be a CMOS/CCD image sensor or display. In a further aspect, a camera may comprise the image sensor or display of the second aspect. The camera may be included in a mobile device, such as a telephone or a similar type device, for example.

Also disclosed is an image sensor configured as a wafer level packaged integrated circuit comprising at least one main semiconductor layer and an at least one partially transparent layer. The at least one main semiconductor layer and the at least one partially transparent layer may be bonded together by bonding material to form a bonding layer therebetween. The bonding layer may include gaps between the at least one main semiconductor layer and the at least partially transparent layer at the areas where no bonding material is present.

The at least one main semiconductor layer may comprise an array of pixels. The integrated circuit may further comprise an array of contacts on the underside of the at least one main semiconductor layer to operatively connect to the integrated circuit.

The integrated circuit may be provided with an additional bonding material in the bonding layer between at least some of the contacts and the at least partially transparent layer. The additional bonding material may be operable to transmit forces from the contacts to the at least partially transparent layer.

BRIEF DESCRIPTION OF THE DRAWINGS

Embodiments of the invention will now be described, by way of examples only, with reference to the accompanying drawings, in which.

DETAILED DESCRIPTION OF THE EMBODIMENTS

Figure 1A:
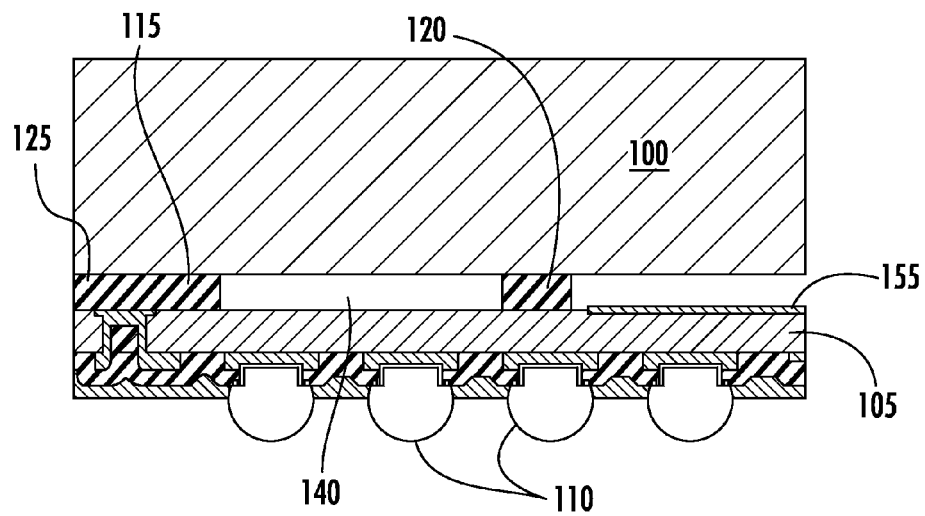
FIGS. 1a and 1b respectively show a side and plan view of a wafer-level packaged integrated circuit in accordance with the prior art.
Figure 1B:
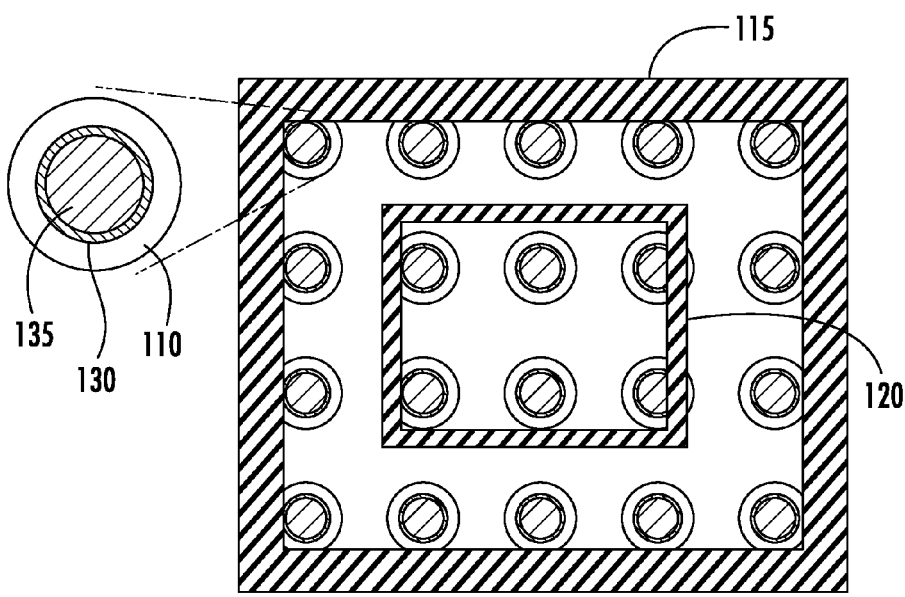

FIGS. 1a and 1b respectively show a side and plan view of a wafer-level packaged integrated circuit as has been previously used. The illustrated wafer-level packaged integrated circuit comprises a glass (or other transparent or semi-transparent material) layer 100 and a silicon substrate or wafer 105 bonded together by an outer bond 115 and inner bond 120. The outer bond 120 is at the die edge 125. An array of solder bumps 110 is provided, with each bump having a metal layer 130 and an underbump metal pad 135 between the silicon bump 110 and the wafer 105. The metal layer 130 provides the interconnection through the silicon vias, which take the front side circuitry through to the backside of the die and allows an interconnection between the vias and the associated solder bumps 110.

A problem with this arrangement is that in the region 140, there is an air gap between the cover glass 100 and the silicon wafer 105. Consequently, any shocks or vibrations to the solder bumps 110 are transmitted in this region 140 to the silicon wafer 105. The silicon layer 105 is inherently fragile, and therefore, any shocks or vibrations to the solder bumps 110 may result in damage to the silicon layer 105.

In the illustrated embodiment, the integrated circuit is an image sensor (although it could equally be a display). An image array or pixel array 155 is located inside the inner bond 120. In use, light enters the integrated circuit package through the glass 100 and through the air gap onto the pixel array 155 where it is sensed.

The air gap over the optically sensitive area is preferable to improve performance. Having bonding material/glue in the optically sensitive area would result in absorption of light in the bonding layer, thus reducing the efficiency of the system. The presence of an air gap over the optically sensitive area removes this loss, leaving only the losses due to the glass 100 (which are less than those associated with light absorption in the glue materials).

Figure 2A:
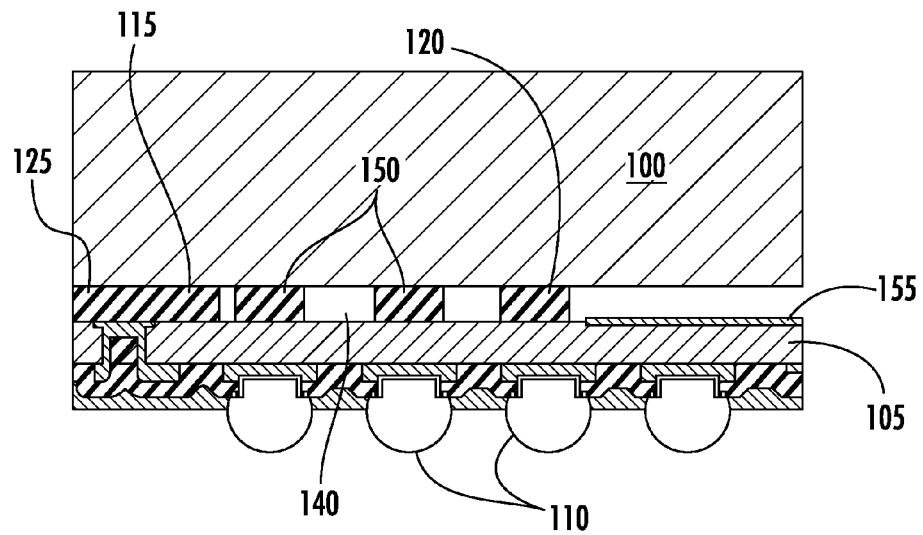
FIGS. 2a and 2b respectively show a side and plan view of a wafer-level packaged integrated circuit in accordance with the present invention.
Figure 2B:
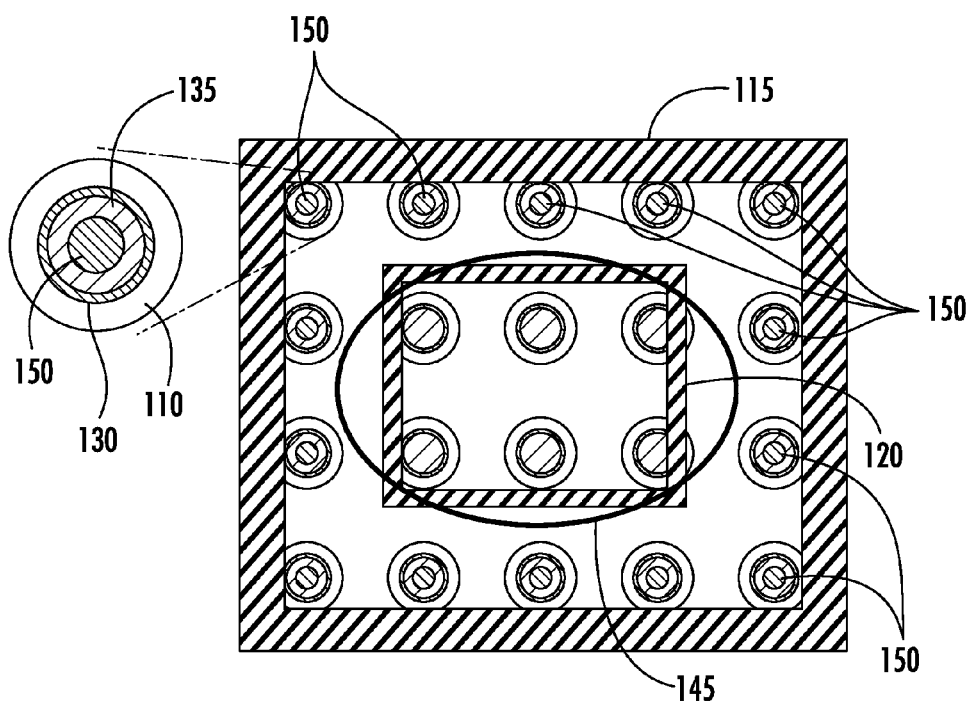

FIGS. 2a and 2b respectively show a side and plan view respectively of a wafer-level packaged integrated circuit in accordance with the present invention. This arrangement differs from the first aspect arrangement described above by the addition of a bond layer structure 150 between the glass layer 100 and the silicon wafer 105 at each solder bump 110 location outside the image array area 145. The image array area 145, in this case the area inside the inner bond 120, is kept free from any additional bond material.

This arrangement allows for force transmission from the solder bumps 110 through to the glass substrate 100, therefore directing stress away from the fragile silicon structure 105 to the more rigid glass structure 100. The illustrated implementation provides strength through a polymer type material, which is already used in the bond layer. This results in an increase in the overall mechanical strength of the final device.

Furthermore, the additional bond layer structure 150 is provided in the existing bond layer. The existing bond layer is modified to specifically add bond structures 150 into the areas where the solder bumps 110 are placed on the die. Therefore, the existing manufacturing/fabrication process does not require any significant changes other than those required at the design and masking level.

The wafer-level packaged integrated circuit may be configured as a three-dimensional structure using TSV (Through Silicon Via) technology.

Figure 3A:
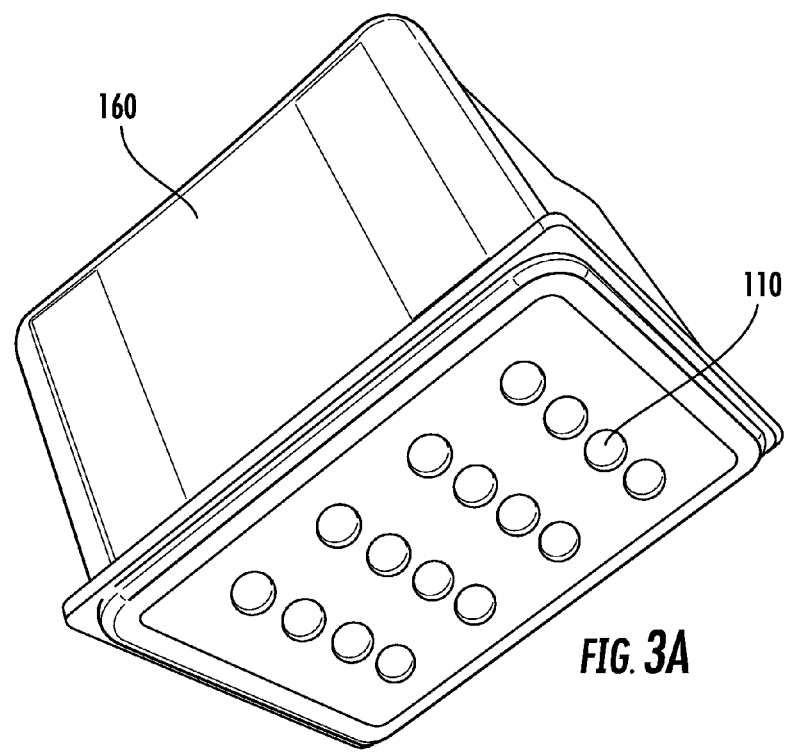
FIGS. 3a and 3b show a camera module with a wafer-level packaged integrated circuit for a mobile telephone or a similar type device in accordance with the present invention.
Figure 3B:
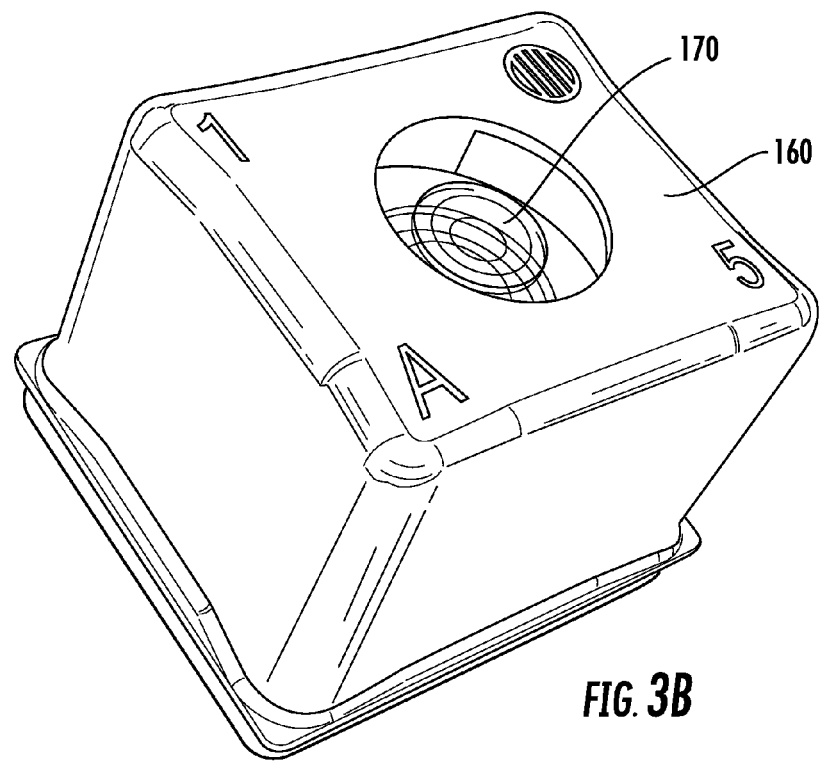

FIGS. 3a and 3b show a camera module suitable for a mobile telephone or a similar type device. Because of the manufacturing techniques used, it is possible to manufacture camera modules like this, which are inexpensive to produce and are very small (on the order of magnitude of a few millimeters in each dimension). The camera module has a casing 160 which holds a lens 170 a suitable distance above the pixel array 155, so that it focuses light through the glass 110 and onto the pixel array 155. On the underside the solder bumps 110 can be seen. These solder bumps allow the camera to be operatively coupled to a circuit board of a device, such as a mobile telephone.

While this detailed description has set forth some embodiments of the present invention, the appended claims cover other embodiments of the present invention which differ from the described embodiments according to various modifications and improvements and/or which can be conceived without departing from the scope of the invention. For example, not all the solder bumps outside the pixel array need to be provided with the additional bonding material between it and the glass layer. Other patterns of additional bonding material may be used instead, such as under every other solder bump, for example. Furthermore, the invention is not limited to image sensors, but may be applicable to any suitable integrated circuit.

In the latter case, there may not be a glass or otherwise transparent layer as there may not be a need to admit light. However, a protective layer may still be provided, which could be any suitably rigid material, whether opaque or transparent.

That which is claimed is:

1. A packaged integrated circuit comprising:
    a semiconductor layer;
    a pixel array on said semiconductor layer and defining a pixel array area;
    a protective layer;
    a bonding material layer bonding said protective layer to said semiconductor layer and comprising inner and outer bonds to define gaps between said semiconductor layer and said protective layer at areas where no bonding material is present;
    an array of contacts adjacent said semiconductor layer on a side thereof opposite said bonding layer; and
    additional bonding material layer portions within the gaps between said inner and outer bonds, and each bonding additional material layer portion being aligned with a respective contact outside of the pixel array area.

2. The packaged integrated circuit according to claim 1 wherein said additional bonding material layer portions are laterally adjacent said bonding material layer.

3. The packaged integrated circuit according to claim 1 wherein said additional bonding material layer portions are aligned to transmit forces applied thereto to said protective layer.

4. The packaged integrated circuit according to claim 1 wherein said bonding material layer is arranged in rectilinear paths.

5. The packaged integrated circuit according to claim 4 wherein the rectilinear paths include a plurality of rectangular paths, one inside the other.

6. The packaged integrated circuit according to claim 1 wherein each contact comprises a solder bump.

7. The packaged integrated circuit according to claim 1 wherein said semiconductor layer, said protective layer, said bonding material layer, said array of contacts, and said additional bonding material layer portions are configured as a three-dimensional structure based on TSV (Through Silicon Via) technology.

8. A packaged image sensor comprising:
    a semiconductor layer;
    an array of pixels on at least a portion of said semiconductor layer and defining a pixel array area;
    a protective layer comprising a partially transparent material to allow light therethrough to said array of pixels;

a bonding material layer bonding said protective layer to said semiconductor layer and comprising inner and outer bonds to define gaps between said semiconductor layer and said protective layer at areas where no bonding material is present;

an array of contacts adjacent said semiconductor layer on a side thereof opposite said bonding layer; and additional bonding material layer portions within the gaps between said inner and outer bonds, and each bonding additional material layer portion being aligned with a respective contact outside of the pixel array area.

9. The packaged image sensor according to claim 8 wherein the partially transparent material in said protective layer comprises glass.

10. The packaged image sensor according to claim 8 wherein the pixel array area is devoid of said additional bonding material layer portions.

11. The packaged image sensor according to claim 10 wherein said additional bonding layer portions overlie all of a remaining portion of the contacts on said semiconductor layer except for the contacts associated with the area devoid of said additional bonding material layer portions.

12. The packaged image sensor according to claim 8 wherein said array of pixels is configured so that the packaged image sensor is a CMOS/CCD image sensor.

13. The packaged image sensor according to claim 8 is configured as part of a mobile device comprising at least one of a camera and a telephone.

14. The packaged image sensor according to claim 8 is configured as a display.

15. A method for making a packaged integrated circuit comprising:

forming a pixel array on a semiconductor layer and defining a pixel array area;

using a bonding material layer to bond a protective layer to the semiconductor layer and comprising inner and outer bonds to define defining gaps therebetween at areas where no bonding material is present;

forming an array of contacts adjacent the semiconductor layer on a side thereof opposite the bonding layer; and using additional bonding material layer portions within the gaps between the inner and outer bonds, and each additional bonding material layer portion being aligned with a respective contact outside of the pixel array area.

16. The method according to claim 15 wherein the additional bonding material layer portions are laterally adjacent the bonding material layer.

17. The method according to claim 15 wherein said additional bonding material layer portions are aligned to transmit forces applied thereto to the protective layer.

18. The method according to claim 15 wherein the bonding material layer is arranged in rectilinear paths.

19. The method according to claim 18 wherein the rectilinear paths include a plurality of rectangular paths, one inside the other.

20. The method according to claim 15 wherein each contact comprises a solder bump.

21. The method according to claim 15 wherein the semiconductor layer, the protective layer, the bonding layer, the array of contacts, and the additional bonding layer are configured as a three-dimensional structure based on TSV (Through Silicon Via) technology.

\* \* \* \* \*